(12) United States Patent
Chen et al.

(10) Patent No.: US 6,784,071 B2
(45) Date of Patent: Aug. 31, 2004

(54) BONDED SOI WAFER WITH <100> DEVICE LAYER AND <110> SUBSTRATE FOR PERFORMANCE IMPROVEMENT

(75) Inventors: Haur-Ywh Chen, Kaohsiung (TW); Yi-Ling Chan, Mianoli (TW); Kuo-Nan Yang, Taipei (TW); Fu-Liang Yang, Hsin-Chu (TW); Chenming Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1 day.

(21) Appl. No.: 10/355,872

(22) Filed: Jan. 31, 2003

(65) Prior Publication Data

US 2004/0151917 A1 Aug. 5, 2004

(51) Int. Cl.[7] .............................................. H01L 21/30
(52) U.S. Cl. ....................... 438/401; 438/406; 438/977
(58) Field of Search ................................. 438/401, 406, 438/455, 459, 974, 975, 977

(56) References Cited

U.S. PATENT DOCUMENTS

| | | | |
|---|---|---|---|
| 5,272,104 A | | 12/1993 | Schrantz et al. .............. 437/63 |
| 5,310,446 A | | 5/1994 | Konishi et al. ................ 117/58 |
| 5,804,495 A | * | 9/1998 | Saito et al. .................. 438/406 |
| 5,869,386 A | * | 2/1999 | Hamajima et al. ........... 438/406 |
| 6,066,513 A | * | 5/2000 | Pogge et al. ................. 438/401 |
| 6,159,824 A | | 12/2000 | Henley et al. ............... 438/455 |
| 6,271,101 B1 | | 8/2001 | Fukunaga ..................... 438/455 |
| 6,372,609 B1 | * | 4/2002 | Aga et al. .................... 438/459 |
| 6,387,829 B1 | * | 5/2002 | Usenko et al. ............... 438/977 |

OTHER PUBLICATIONS

Barth, "Silicon Fusion Bonding for Fabrication of Sensors, Actuators and Microstructures", Sensors and Actuators, A21–A23 (1990) 919–926.

Sayama et al. "Effect of <100> Channel Direction for High Performance SCE Immune pMOSFET with Less Than 0.15μm Gate Length", 1999 IEEE, IEDM99–657, 27.5.1–27.5.3.

* cited by examiner

*Primary Examiner*—Chandra Chaudhari
(74) *Attorney, Agent, or Firm*—Haynes and Boone, LLP

(57) ABSTRACT

A new silicon structure is provided. Under a first embodiment of the invention, a first silicon substrate having a <100> crystallographic orientation is bonded to the surface of a second silicon substrate having a <110> crystallographic orientation, the wafer alignment notch of the first and the second silicon substrates are aligned with each other. Under a first embodiment of the invention, a first silicon substrate having a <100> crystallographic orientation is bonded to the surface of a second silicon substrate having a <110> crystallographic orientation, the wafer alignment notch of the first and the second silicon substrates are not aligned with each other.

8 Claims, 3 Drawing Sheets

*(100) SURFACE WAFER*

Top wafer:<100>;bottom wafer:<110>

Top wafer:<100>
bottom wafer:<110>

BONDED SOI WAFER WITH <100> DEVICE LAYER AND <110> SUBSTRATE FOR PERFORMANCE IMPROVEMENT

BACKGROUND OF THE INVENTION (1) Field of the Invention

The invention relates to the fabrication of integrated circuit devices, and more particularly, to a method to increase hole mobility and immunity to short channel effect for the creation of CMOS devices.

(2) Description of the Prior Art

It is well known in the art that Integrated Circuit (IC) devices that are created over Semiconductor-On-Insulator (SOI) surfaces have significant performance advantages such as reduced parasitic capacitances, reduced power consumption, increased resistance against radiation, increased ability to operate at more elevated temperatures, operational capabilities at higher applied voltages, multilayer device integration and, for CMOS devices, increased freedom from latch-up of the operational devices. It is common practice in the creation of SOI devices, whereby the semiconductor is the upper layer, to create active surface regions by creating isolation trenches through the semiconductor layer down to the isolation layer, whereby the sidewalls of such trenches are covered with an insulation material such as silicon dioxide, silicon nitride, silicon oxynitride, CVD oxide, and the like.

One of the methods that is applied in the semiconductor technology for the extension of the crystalline nature of the silicon substrate is to grow a layer of epitaxy over the surface of the silicon substrate. The epitaxial layer, comprised of silicon, can be formed by conventional deposition techniques of contacting the substrate with a flow of gas (e.g. silicon tetrachloride) at an elevated temperature, the epitaxial layer can for instance include a N-well region and a P-well region previously created in the surface of a silicon substrate. Such an epitaxial layer may advantageously be grown because it may provide lower impurity concentrations and may even be of a different semiconductor type as the wafer over which it is grown. Semiconductor devices are in this case created in the active layer of the stack, which is typically only about a micron thick.

One of the more serious drawbacks of the use of epitaxial layers is that such a layer typically adopts the crystalline structure of the substrate over which the layer is created. In most applications, the underlying substrate is a monocrystalline substrate having a particular crystallographic orientation, thus potentially causing a conflict between a desired crystallographic orientation of the epitaxial layer and the crystallographic orientation of the substrate over which the epitaxial layer is grown. Additionally, successful creation of an epitaxial layer over a surface requires extreme preparation of the conditions of cleanliness of this surface in order to avoid the occurrence of undesirable crystalline defects (such as "pipes" and "spikes") in the interface between the overlying layers. These and other considerations, which become more of a problem for semiconductor devices of increased complexity and increased surface area over which the devices are created, leads to the requirement of creating overlying surfaces of a crystalline nature that can be used for the creation of semiconductor devices.

It is well known in the art that the creation of semiconductor devices conventionally starts with a monocrystalline silicon substrate having <100> plane orientation. Other plane orientations of the cubic crystals that form the silicon substrate, such as <110> and <111>, are also well known but are, for considerations of device performance and wafer dicing, less frequently used. The invention provides a method that makes available a bonded SOI wafer with a <100> layer for the creation of active devices and a <110> substrate layer for performance improvements.

U.S. Pat. No. 6,271,101 B1 (Fukunaga) shows a SOI bonding process that discusses crystal orientation.

U.S. Pat. No. 5,310,446 (Konishi et al.) discloses a SOI bond process that discusses different orientation crystals.

U.S. Pat. No. 6,159,824 (Henley et al.) shows another SOI bond process discussing different orientation crystals.

U.S. Pat. No. 5,272,104 (Schrantz et al.) shows a SOI bonding process.

Article titled: Effect of <100> Channel direction for high Performance SCE Immune pMOSFET with Less Than 0.15 $\mu$m gate Length, H. Sayama et al., IEDM 1999.

SUMMARY OF THE INVENTION

A principle objective of the invention is to provide a silicon crystalline structure that can be advantageously used for the creation of semiconductor devices therewith.

Another objective of the invention is to provide a silicon crystalline structure of which an upper layer can be advantageously used for the creation of semiconductor devices therein and of which a lower layer can be advantageously used for the dicing of the created semiconductor devices.

Yet another objective of the invention is to provide a silicon crystalline structure such that semiconductor devices of improved device performance can be created in the surface thereof.

A still further objective of the invention is to provide a combination of semiconductor substrates having different planes of crystallographic orientation.

In accordance with the objectives of the invention a new silicon structure is provided. Under a first embodiment of the invention, a first silicon substrate having a <100> crystallographic orientation is bonded to the surface of a second silicon substrate having a <110> crystallographic orientation, the wafer alignment notch of the first and the second silicon substrates are aligned with each other. Under a first embodiment of the invention, a first silicon substrate having a <100> crystallographic orientation is bonded to the surface of a second silicon substrate having a <110> crystallographic orientation, the wafer alignment notch of the first and the second silicon substrates are not aligned with each other.

DESCRIPTION OF THE PREFERRED EMBODIMENTS

Figure 1:
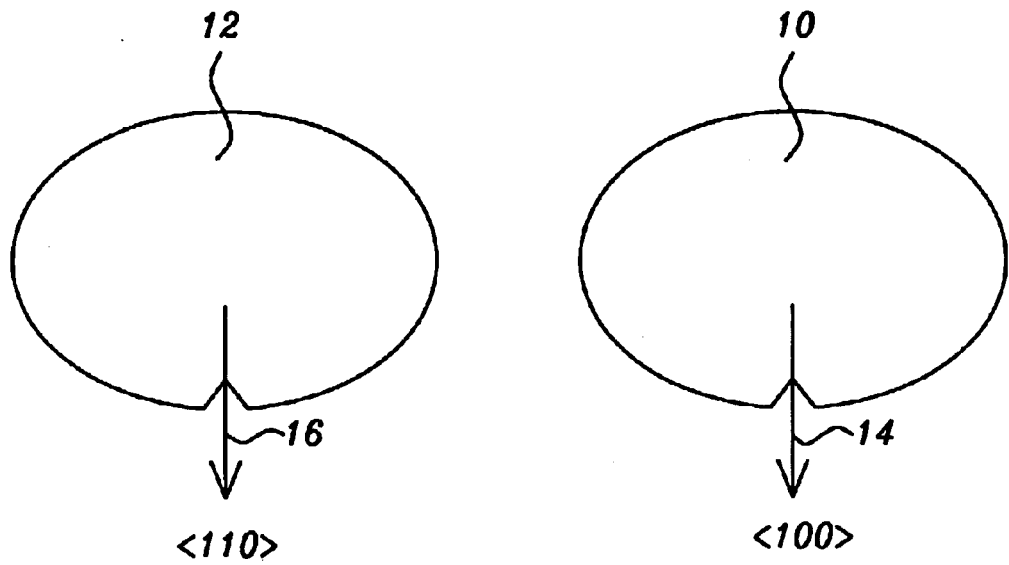
FIGS. 1 through 3 show top views and a cross section relating to the first embodiment of the invention, a first silicon substrate having a <100> crystallographic orientation is bonded to the surface of a second silicon substrate having a <110> crystallographic orientation, the wafer alignment notches of the first and the second silicon substrates are aligned with each other.

Referring now specifically to FIG. 1, there is shown of top view of wafer 10, having <100> crystallographic orientation and having a wafer 10 alignment notch 14. Also shown in FIG. 1 is wafer 12, in this case having <110> crystallographic orientation and having a wafer 12 alignment notch 16. The two wafers that are shown in top view in FIG. 1 are, FIG. 2, aligned with each other with wafer 10 being positioned above the surface of wader 12. Prior to this alignment of the two wafers 10 and 12, a layer 18 of hydrogen based material has been deposited over the surface of wafer 12.

Figure 2:
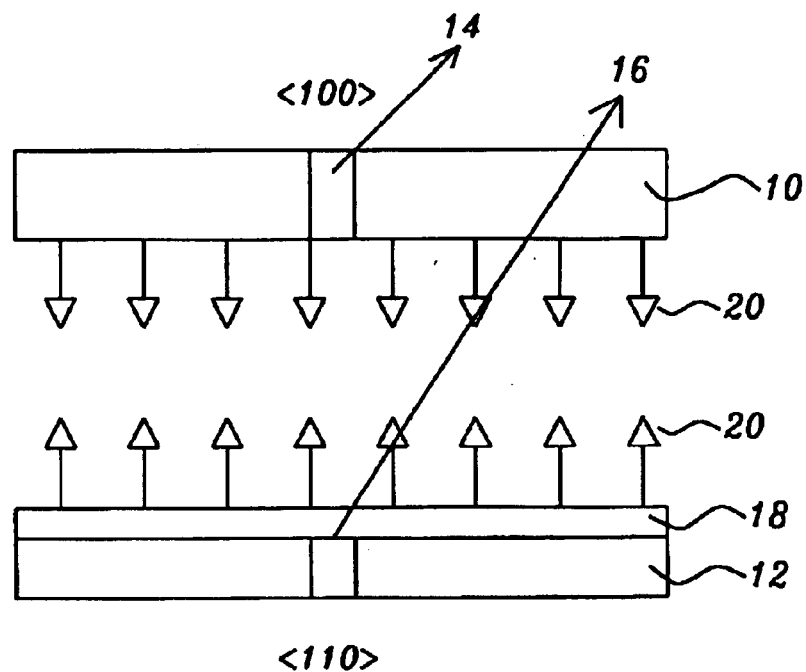

After the alignment of the two wafers 10 and 12 has been performed as shown in the cross section of FIG. 2, the two wafers are via motion 20 brought in physical contact with each other and are bonded together, whereby the lower surface of wafer 10 overlies the surface of the layer 18 of a hydrogen based material.

The bonding of the two substrates 10 and 12 is accomplished by:
1. Polishing the surface of the substrate where these surfaces interface
2. Making the polishing surface of the substrate hydrophilic by creating layer 18 over the surface of substrate 12
3. Heating the two wafers 10 and 12 for a time between about 30 seconds and 3 minutes, at a temperature between about 800 and 1,400 degrees C., forming hydrogen bonds in the interface between substrates 10 and 12.

As examples, hydrogen based layer 18 can consist of:
silicon oxide, containing monosilane ($SiH_4$) and nitrous oxide ($N_2O$)
silicon nitride, containing monosilane ($SiH_4$) and ammonia ($NH_3$), and
silicon oxynitride, containing monosilane ($SiH_4$), ammonia ($NH_3$) and nitrous oxide ($N_2O$)

From the cross section of the two wafers 10 and 12 that is shown in FIG. 2, it is clear that the wafer alignment notches 14 (wafer 10) and 16 (wafer 12) are aligned with each other, that is wafer alignment notch 14 is aligned with (overlies) wafer alignment notch 16.

Figure 3:
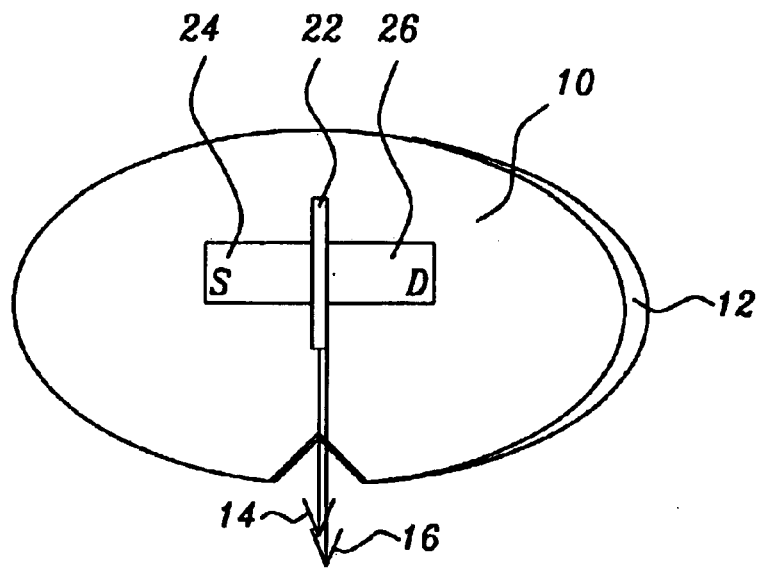

Proceeding to the top view of wafers 10 and 12 that is shown in FIG. 3, the alignment of wafer alignment notches is more clear in this top view while, as an example of the advantageous use of the upper silicon substrate 10, the creation of a CMOS device over the surface of this wafer 10 has been highlighted with the gate electrode 22 and the therewith self-aligned source impurity implantation 24 and drain impurity implantation 26, both impurity implantations having been performed in the exposed surface of the upper wafer 10 of <100> crystallographic orientation.

Conventional semiconductor device advantages of using a silicon surface of <100> crystallographic orientation, such as hole mobility and improved immunity to the short channel effect of the gate electrode 22, are in this manner retained. By adding the lower wafer 12 to the thus created wafer stack, dicing of the created semiconductor devices, created in the exposed surface of wafer 10, can be readily performed.

Figure 4:
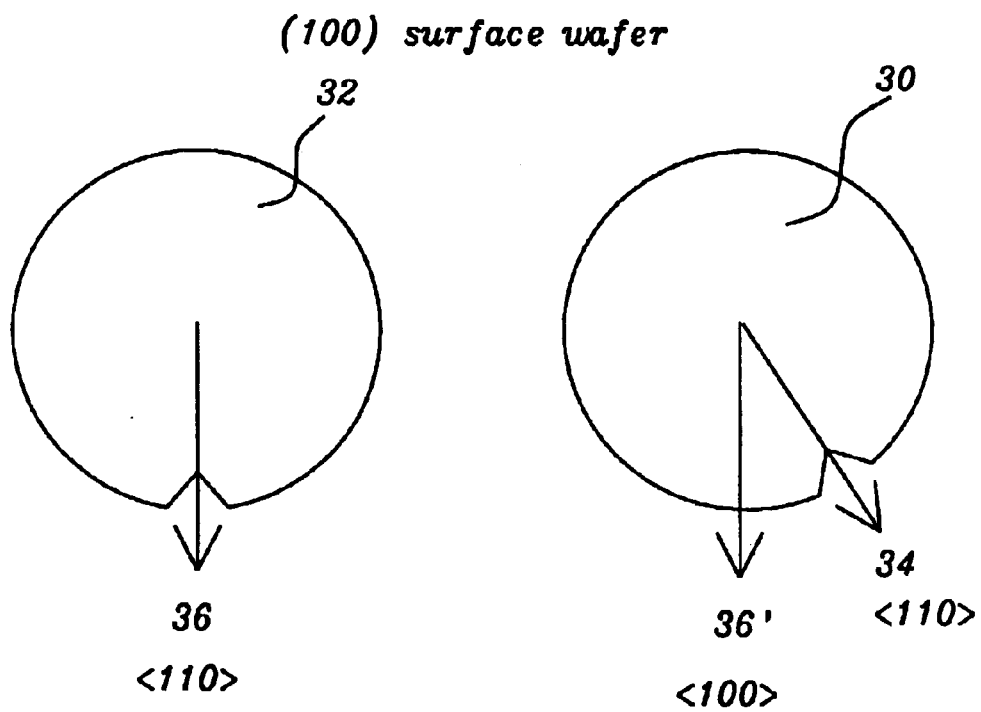
FIGS. 4 through 6 shows top views and a cross section relating to the second embodiment of the invention, a first silicon substrate having a <100> crystallographic orientation is bonded to the surface of a second silicon substrate having a <110> crystallographic orientation, the wafer alignment notches of the first and the second silicon substrates are not aligned with each other.

Proceeding with the second embodiment of the invention, FIG. 4 shows of top view of wafer 30, having <100> crystallographic orientation and having a wafer 30 alignment notch 34. Also shown in FIG. 4 is wafer 32, in this case having <110> crystallographic orientation and having a wafer 32 alignment notch 36.

In the top view of the two wafers 30 and 32 that is shown in FIG. 4 is further highlighted the wafer alignment notch 36' which is the relative position of the wafer alignment notch 36 of wafer 32 with respect to the wafer alignment notch 34 of wafer 30. Alignment notch 36' as shown in FIG. 4 is therefore not an actual alignment notch but only an indication of the relative positioning of alignment notches 34 and 36.

Figure 5:
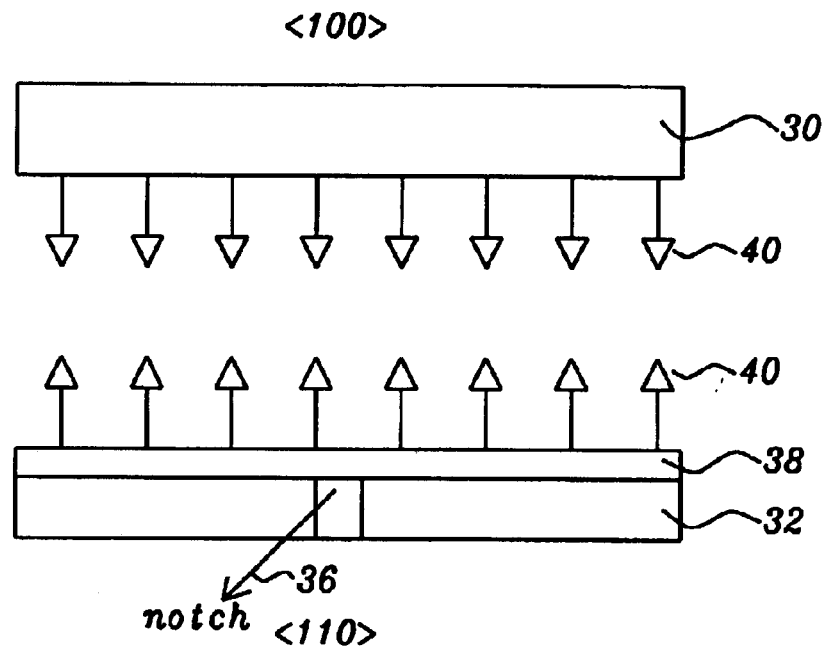

The two wafers that are shown in top view in FIG. 4 are, FIG. 5, aligned with each other with wafer 30 being positioned above the surface of wader 32. Prior to this alignment of the two wafers 30 and 32, a layer 38, preferably comprising of a hydrogen based material, has been deposited over the surface of wafer 32.

As examples, hydrogen based layer 38 can consist of:
silicon oxide, containing monosilane ($SiH_4$) and nitrous oxide ($N_2O$)
silicon nitride, containing monosilane ($SiH_4$) and ammonia ($NH_3$), and
a silicon oxynitride, containing monosilane ($SiH_4$), ammonia ($NH_3$) and nitrous oxide ($N_2O$).

After the alignment of the two wafers 30 and 32 has been performed as shown in the cross section of FIG. 5, the two wafers are via motion 40 brought in physical contact with each other and are bonded together, whereby the lower surface of wafer 30 overlies the surface of the layer 38 of hydrogen based material.

The bonding of the two substrates 30 and 32 is accomplished by:
1. Polishing the surface of the substrate where these surfaces interface
2. Making the polishing surface of the substrate hydrophilic by creating layer 38 over the surface of substrate 32
3. heating the two wafers 30 and 32 for a time between about 30 seconds and 3 minutes, at a temperature between about 800 and 1,400 degrees C., forming hydrogen bonds in the interface between substrates 30 and 32.

From the cross section of the two wafers 30 and 32 that is shown in FIG. 5, it is clear that the wafer alignment notches 34 (wafer 30 and not visible) and 36 (wafer 32 and visible) are not aligned with each other, that is wafer alignment notch 34 is not aligned with (does not overly) wafer alignment notch 36.

Figure 6:
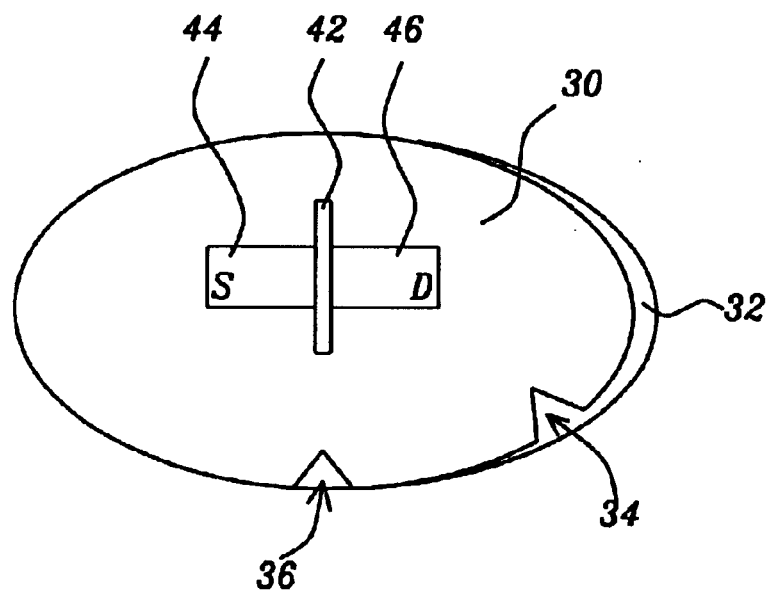

Proceeding to the top view of wafers 30 and 32 that is shown in FIG. 6, the alignment of wafer alignment notches is more clear in this top view while, as an example of the advantageous use of the upper silicon substrate, the creation of a CMOS device over the surface of this wafer 30 has been highlighted with the gate electrode 42 and the therewith self-aligned source impurity implantation 44 and drain impurity implantation 46, both impurity implantations having been performed in the exposed surface of the upper wafer 30 of <100> crystallographic orientation.

Conventional semiconductor device advantages of using a silicon surface of <100> crystallographic orientation, such as hole mobility and improved immunity to the short channel effect of the gate electrode 42, are in this manner retained. By adding the lower wafer 32 to the thus created wafer stack, dicing of the created semiconductor devices, created in the exposed surface of wafer 30, can be readily performed.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for creating a silicon-on-insulation substrate, comprising the steps of:

providing a first silicon substrate, said first silicon substrate having a <100> crystal orientation, said first substrate having a first and a second surface, further having a first wafer notch;

providing a second silicon substrate, said second silicon substrate having a <110> crystal orientation, said second substrate having a first and a second surface, further having a second wafer notch;

polishing the first surface of the first substrate and the second surface of the second substrate;

making the polished second surface of the second substrate hydrophilic by depositing a layer of hydrogen based material over the second surface of said second substrate;

positioning said first substrate in alignment with said second substrate above the second substrate, the first surface of the first substrate facing the second surface of the second substrate, said first alignment notch of said first substrate being aligned with said second alignment notch of said second substrate;

contacting the first surface of said first substrate with the surface of said layer of hydrogen based material deposited over the second surface of said second substrate; and bonding the first surface of said first substrate with the second surface of said second substrate by applying conditions of bonding to the first and the second substrate.

2. The method of claim 1, said hydrogen based material being selected from the group consisting of silicon oxide, containing monosilane (SiH$_4$) and nitrous oxide (N$_2$O), and silicon nitride, containing monosilane (SiH$_4$) and ammonia (NH$_3$), and silicon oxynitride, containing monosilane (SiH$_4$), ammonia (NH$_3$) and nitrous oxide (N$_2$O).

3. The method of claim 1, said conditions of bonding comprising heating said first and said second substrate for a time between about 30 seconds and 3 minutes, at a temperature between about 800 and 1,400 degrees C., under atmospheric conditions of pressure, forming hydrogen bonds in the interface between the first and the second substrate, said interface comprising the first surface of said first substrate and the second surface of the second substrate.

4. A method for creating a silicon-on-insulation substrate, comprising the steps of:

providing a first silicon substrate, said first silicon substrate having a <100> crystal orientation, said first substrate having a first and a second surface, further having a first wafer notch;

providing a second silicon substrate, said second silicon substrate having a <110> crystal orientation, said second substrate having a first and a second surface, further having a second wafer notch;

polishing the first surface of the first substrate and the second surface of the second substrate;

making the polished second surface of the second substrate hydrophilic by depositing a layer of hydrogen based material over the second surface of said second substrate;

positioning said first substrate in alignment with said second substrate above the second substrate, the first surface of the first substrate facing the second surface of the second substrate, said first alignment notch of said first substrate being aligned with said second alignment notch of said second substrate;

contacting the first surface of said first substrate with the surface of said layer of hydrogen based material deposited over the second surface of said second substrate; and bonding the first surface of said first substrate with the second surface of said second substrate by applying conditions of bonding to the firsthand the second substrate.

5. The method of claim 4, said hydrogen based material being selected from the group consisting of silicon oxide, containing monosilane (SiH$_4$) and nitrous oxide (N$_2$O), and silicon nitride, containing monosilane (SiH$_4$) and ammonia (NH$_3$), and silicon oxynitride, containing monosilane (SiH$_4$), ammonia (NH$_3$), and nitrous oxide (N$_2$O).

6. The method of claim 4, said conditions of bonding comprising heating said first and said second substrate for a time between about 30 seconds and 3 minutes, at a temperature between about 800 and 1,400 degrees C., under atmospheric conditions of pressure, forming hydrogen bonds in the interface between the first and the second substrates, said interface comprising the first surface of said first substrate and the second surface of the second substrate.

7. The method of claim 1, additionally creating semiconductor devices in or over the surface of said silicon-on-insulation substrate.

8. The method of claim 4, additionally creating semiconductor devices in or over the surface of said silicon-on-insulation substrate.

* * * * *